(12) United States Patent
Kuo et al.

(10) Patent No.: US 9,117,909 B2
(45) Date of Patent: Aug. 25, 2015

(54) NON-PLANAR TRANSISTOR

(71) Applicant: UNITED MICROELECTRONICS CORP., Hsin-Chu (TW)

(72) Inventors: Lung-En Kuo, Tainan (TW); Po-Wen Su, Kaohsiung (TW); Chen-Yi Weng, New Taipei (TW); Hsuan-Hsu Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/470,957

(22) Filed: Aug. 28, 2014

(65) Prior Publication Data

US 2014/0367798 A1    Dec. 18, 2014

Related U.S. Application Data

(62) Division of application No. 13/863,393, filed on Apr. 16, 2013, now Pat. No. 8,853,015.

(51) Int. Cl.
*H01L 29/78* (2006.01)
*H01L 21/762* (2006.01)
*H01L 29/66* (2006.01)
*H01L 27/088* (2006.01)
*H01L 29/06* (2006.01)

(52) U.S. Cl.
CPC ...... *H01L 29/7851* (2013.01); *H01L 21/76224* (2013.01); *H01L 27/0886* (2013.01); *H01L 29/0649* (2013.01); *H01L 29/66795* (2013.01); *H01L 29/7853* (2013.01)

(58) Field of Classification Search
CPC ............ H01L 29/66795; H01L 29/785; H01L 29/7853
USPC .................................................. 257/347, 510
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Shaheen | |
| 8,110,466 B2 * | 2/2012 | Shieh et al. | 438/268 |
| 8,853,015 B1 * | 10/2014 | Kuo et al. | 438/151 |
| 8,946,829 B2 * | 2/2015 | Wann et al. | 257/401 |

(Continued)

*Primary Examiner* — Mark Prenty
(74) *Attorney, Agent, or Firm* — Winston Hsu; Scott Margo

(57) ABSTRACT

A method of forming a fin structure is provided. First, a substrate is provided, wherein a first region, a second region encompassing the first region, and a third region encompassing the second region are defined on the substrate. Then, a plurality of first trenches having a first depth are formed in the first region and the second region, wherein each two first trenches defines a first fin structure. The first fin structure in the second region is removed. Lastly, the first trenches are deepened to form a plurality of second trenches having a second depth, wherein each two second trenches define a second fin structure. The present invention further provides a structure of a non-planar transistor.

6 Claims, 7 Drawing Sheets

(56) References Cited

U.S. PATENT DOCUMENTS

| | | |
|---|---|---|
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2014/0035066 A1 | 2/2014 | Tsai |

* cited by examiner

NON-PLANAR TRANSISTOR

CROSS REFERENCE TO RELATED APPLICATIONS

This application is a Divisional of application Ser. No. 13/863,393 filed Apr. 16, 2013, and included herein by reference.

BACKGROUND OF THE INVENTION

1. Field of the Invention

The present invention is related to a method of forming a fin structure of a non-planar transistor, and more particularly, to a method of forming at least a fin structure having nearly identical critical dimension (CD).

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In recent years, the development of the Fin-FETS is still aiming to be used in devices with smaller scales.

However, some issues, such as poor CD uniformity of the fin structures of Fin-FETs, are still problems that should be overcome.

SUMMARY OF THE INVENTION

It is one objective of the present invention to provide a method of forming at least a fin structure having nearly identical CD.

According to one embodiment, a method of forming a fin structure is provided. First, a substrate is provided, wherein a first region, a second region encompassing the first region, and a third region encompassing the second region are defined on the substrate. Then, a plurality of first trenches having a first depth are formed in the first region and the second region, wherein each two first trenches defines a first fin structure. The first fin structure in the second region is removed. Lastly, the first trenches are deepened to form a plurality of second trenches having a second depth, wherein each two second trenches define a second fin structure.

According to another embodiment of the present invention, a non-planar transistor is provided. The non-planar transistor comprises a substrate, a plurality of second trenches, a sixth trench, an insulation layer, a conductive layer and a gate dielectric layer. The substrate has an active region and an isolation region, wherein the isolation region encompasses the active region. The second trenches are disposed in the substrate in active region, wherein a portion of the substrate between each two second trenches is defined as a second fin structure. The sixth trench is disposed in the substrate in the isolation region, wherein the sixth trench is deeper than the second trench. An insulation layer is disposed in the second trench and the sixth trench, wherein the insulation layer in the second trench is level with that in the sixth trench. A portion of the second fin structure that protrudes over the insulation layer is defined as a fin structure. The conductive layer is disposed on the fin structure. The gate dielectric layer is disposed between the fin structure and the conductive layer.

By using the method set forth in the present invention, the CD of the fin structures can be uniform and the quality of the devices can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
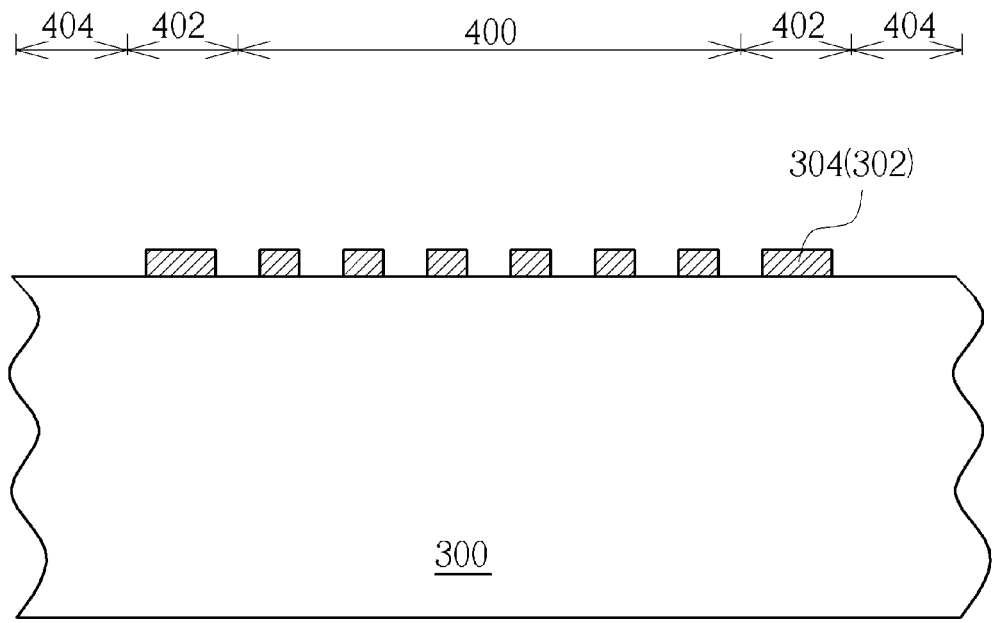
FIG. 1 to FIG. 8 are schematic diagrams of the fabrication method of a non-planar transistor according to the first embodiment in the present invention.

Please refer to FIG. 1 to FIG. 8, which are schematic diagrams of the fabrication method of a non-planar FET according to the first embodiment in the present invention. As shown in FIG. 1, a substrate 300 is provided. In one embodiment, the substrate 300 can be a silicon substrate, an epitaxial silicon substrate, a silicon germanium substrate or a silicon carbide substrate, but is not limited thereto. A first region 400, a second region 402 and a third region 404 are defined on the substrate 300. The second region 402 is disposed between the first region 400 and the third region 404 so that the second region 402 encompasses the first region 400, and the third region 404 encompasses both the first region 400 and the second region 402. A patterned mask layer 302 is formed on the substrate 300. For example, a layer such as a silicon nitride (SiN) layer, a silicon oxynitride (SiON), silicon carbide (SiC) or an advanced pattern film (APF) provided by Applied Materials, is formed on the substrate 300 and a photo-etching-process (PEP) is performed to pattern the mask layer 302. In another embodiment, the method of forming the patterned mask layer 302 can include other processes such as a sidewall image transferring (SIT) process. The mask layer 302 contains a plurality of patterns 304, preferably stripe patterns that are parallel to each other in the first region 400 and the second region 402. In one embodiment, the stripe patterns 304 are disposed only in the first region 400 and the second region 402. As shown in FIG. 1, due to some manufacturing effects such as "dense-isolation effect" or "micro-loading effect", the width of the stripe pattern 304 in the second region 402 would be a little larger than those in the first region 400.

Figure 2:
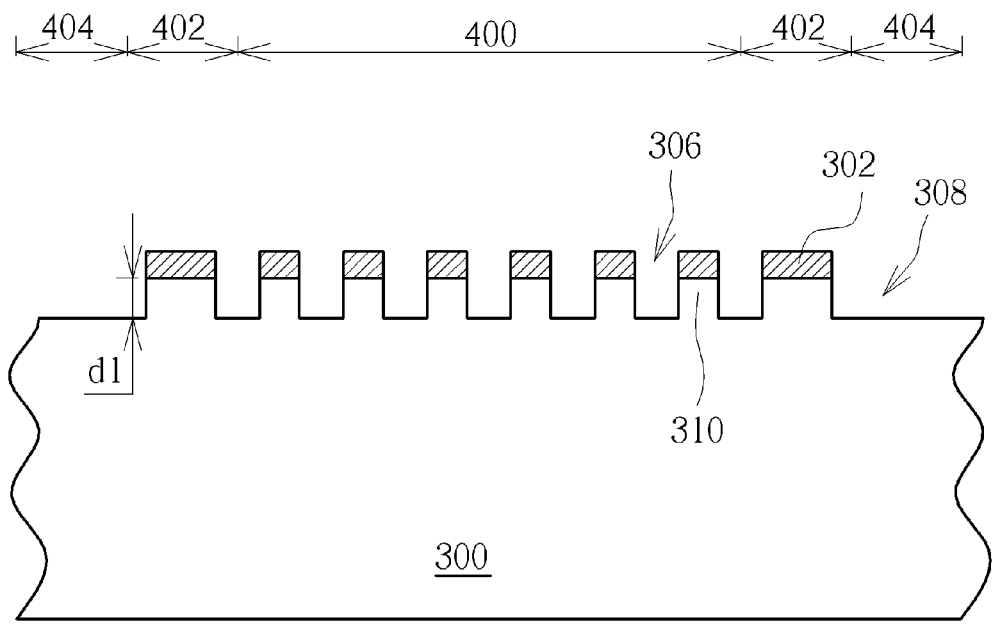

As shown in FIG. 2, an etching process is performed by using the mask layer 302 as a mask to pattern the substrate 300, thereby forming a plurality of first trenches 306 in the first region 400 and the second region 402, and a third trench 308 in the third region 404. By adjusting the etching recipe or the etching rate, the first trench 306 preferably has a substantial vertical sidewall. In one embodiment, each first trench 306 has a depth d1 (from bottom surface of the first trench 306 to a top surface of the substrate 300) which is substantially between 200 and 400 angstroms, preferably 300 and 350 angstroms. Simultaneously, the portion of the substrate 300 between each of the two first trenches 306 becomes a first protruding structure 310 (in the present invention, "the protruding structure" can also called "the fin structure" since the mask layer 302 has stripe patterns 304).

Figure 3:
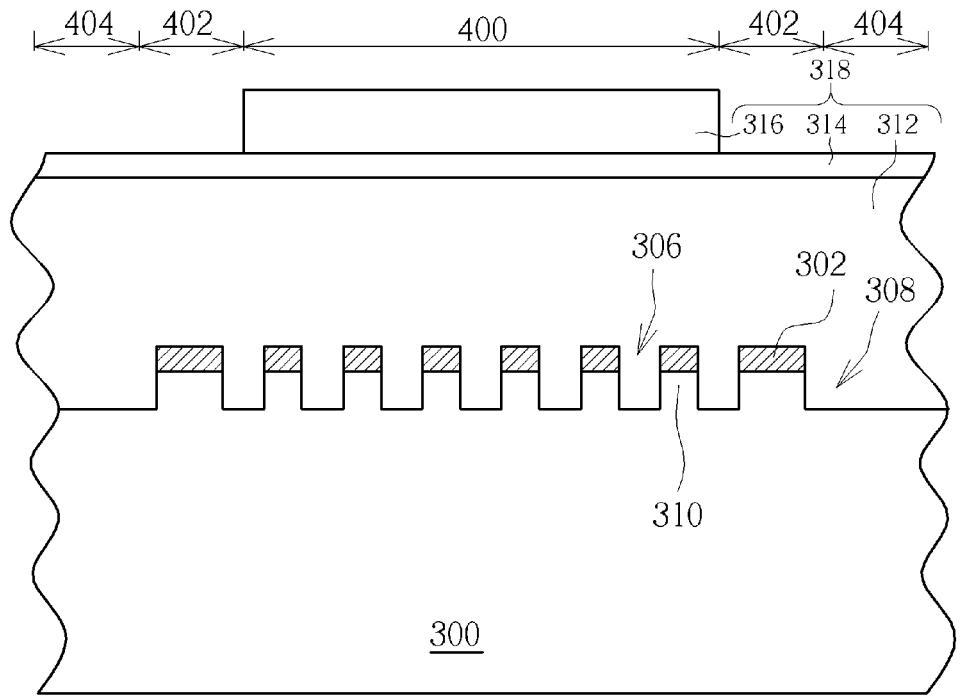
Figure 4:
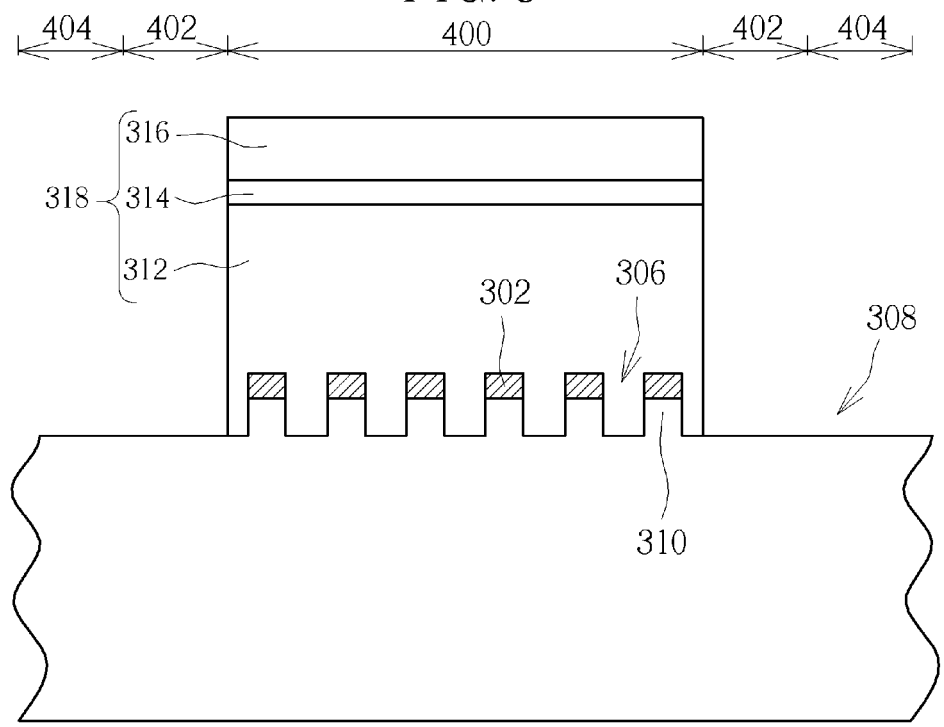

Next, the first protruding structures 310 in the second region 402 are removed. As shown in FIG. 3 to FIG. 4, a photo-etching-process (PEP) using a tri-layer photoresist material 318 is used for example. In one embodiment, the tri-layer photoresist material 318 contains a photoresist layer 316, an anti-reflection coating (ARC) 314 and an auxiliary mask layer 312. In one embodiment, the photoresist layer 316 is a photoresist material suitable for light source having a wavelength of 193 nm. The ARC layer 314 includes a silicon-containing hard-mask bottom anti-reflection coating (SHB) layer and the auxiliary mask layer 312 includes an organic dielectric layer (ODL) provided by Shin-Etsu Chemical Co. Ltd., wherein the SHB layer is disposed directly under the photoresist layer to serve as a BARC and a mask layer, and the ODL layer is an organic underlayer, i.e., a hydrocarbon layer, which is used to serve as an auxiliary mask layer. As shown in FIG. 3, the photoresist layer 316 undergoes an exposure process and a development process to remove the photoresist layer 316 in the second region 402 and the third region 404. Then, as shown in FIG. 4, at least one etching process is performed by using the patterned photoresist layer 316 as a mask to sequentially pattern the ARC layer 314, the auxiliary mask layer 312, and then remove the mask layer 302 and the first protruding structure 310 in the second region 402. In the present embodiment, the etching process stops on the bottom surface of the third trench 308, so the third trench 308 is still level with the first trenches 306. Then, the tri-layer photoresist material 318 is stripped away. It is noted that besides using the tri-layer photoresist material 318, the first protruding structure 310 in the second region 402 can be removed by other methods.

Figure 5:
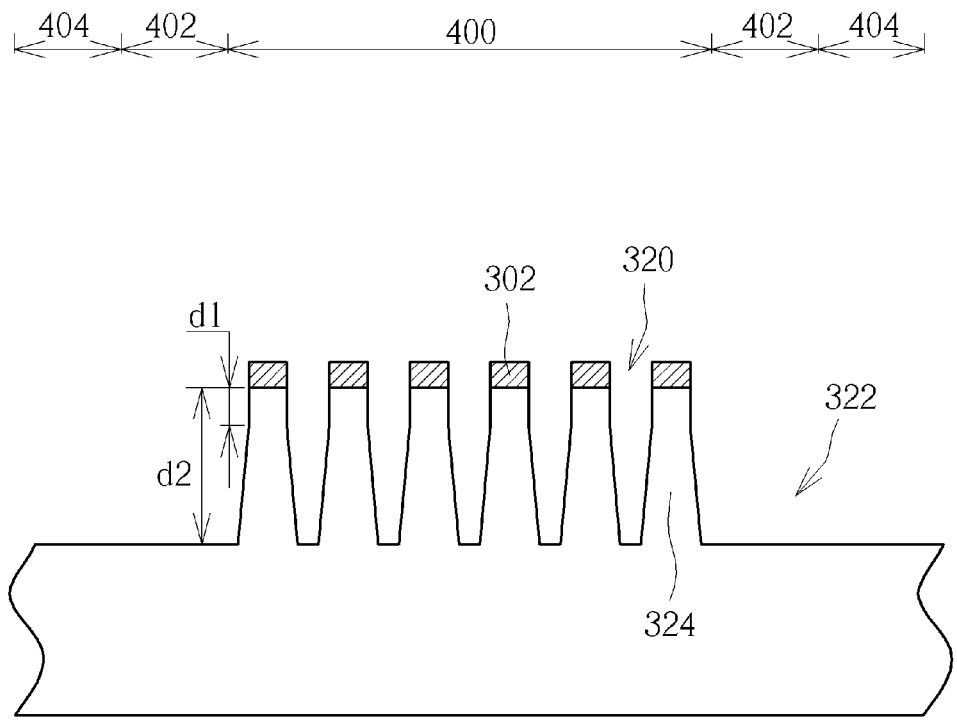

As shown in FIG. 5, an etching process is performed by using the patterned mask layer 302 as a mask to simultaneously deepen the first trenches 306 and the third trench 308. Each first trench 306 in the first region 400 becomes a second trench 320, the third trench 308 in the second region 402 and the third region 404 becomes a fourth trench 322, and the first protruding structure 310 becomes a second protruding structure 324. In one embodiment, each second trench 320 has a depth d2 which is substantially between 1200 angstroms and 2500 angstroms. In the present embodiment, the etching rate of forming the second trench 320 can be faster than that of forming the first trench 306, so the lower portion of the second trench 320 may include tilted sidewalls.

Figure 6:
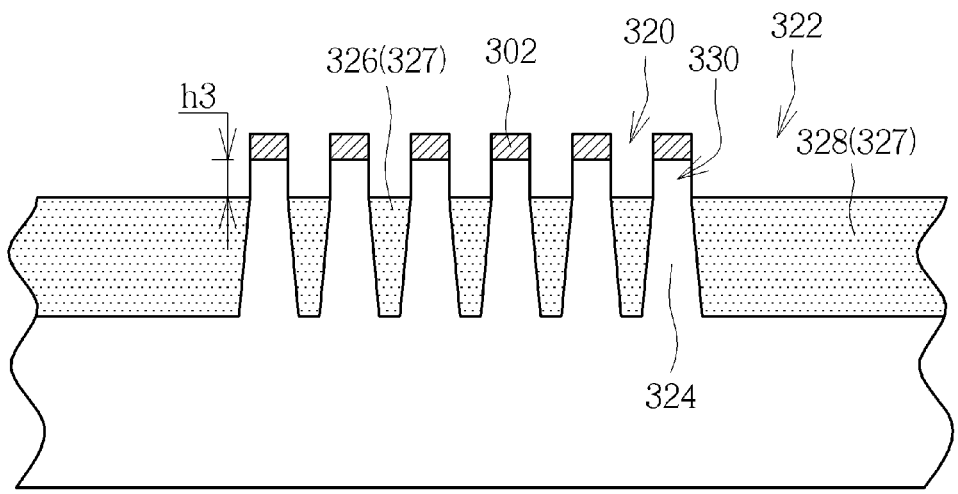

As shown in FIG. 6, an insulation layer 327 is filled into the second trenches 320 and the fourth trench 322 to form a plurality of fin-STIs (shallow trench isolation) 326 in the second trench 320 and an STI 328 in the fourth trench 322. For example, an insulation layer containing $SiO_2$ is deposited on the substrate 300 to completely fill the second trenches 320 and the fourth trench 322. Then, a planarization process including an etching back step is performed to remove apart of the insulation layer 327 until exposing the second protruding structures 324. Preferably, the insulation layer 327 in the second trench 320 has a thickness equal to or greater than the second depth d2. That is, the exposed portion of the second protruding structure 324 has a height h3, and the height h3 is substantially equal to the depth d1. In another embodiment, the height h3 can be smaller than the depth d1. Preferably, the portion of the second protruding structure 324 having the tilted sidewalls is not exposed. After forming the fin-STIs 326 and the STI 328, a plurality of fin structures 330 are therefore formed. The fin structure 330 refers to the portion of the second protruding structures 324 that protrudes over the fin-STIs 326. In other words, the fin structure 330 is the portion of the substrate 300 that is exposed and not covered by the fin-STI 326, so the fin structure 330 has a height h3. In one embodiment, the mask layer 302 can be removed after forming the fin structures 330. In another embodiment, the mask layer 302 can remain.

Figure 7:
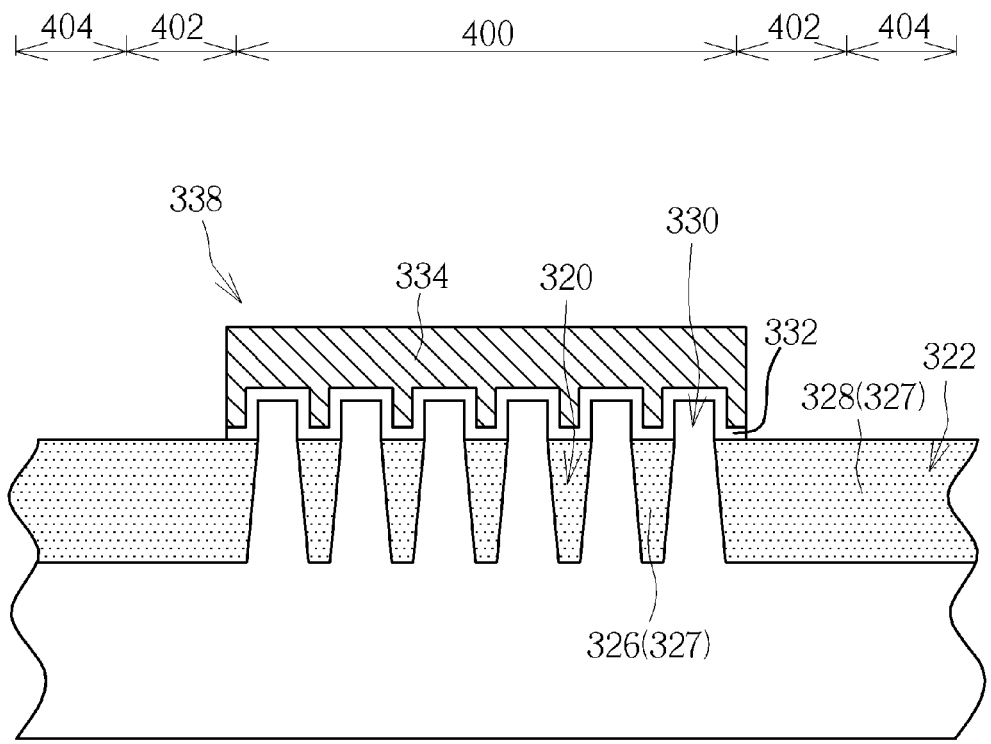
Figure 8:
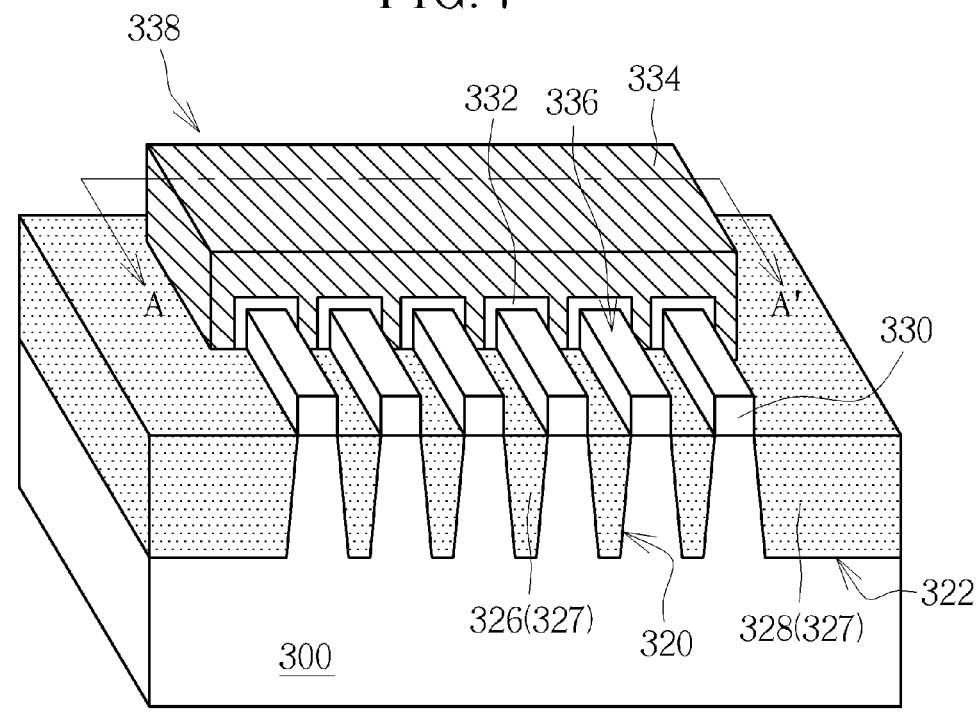
Figure 9:
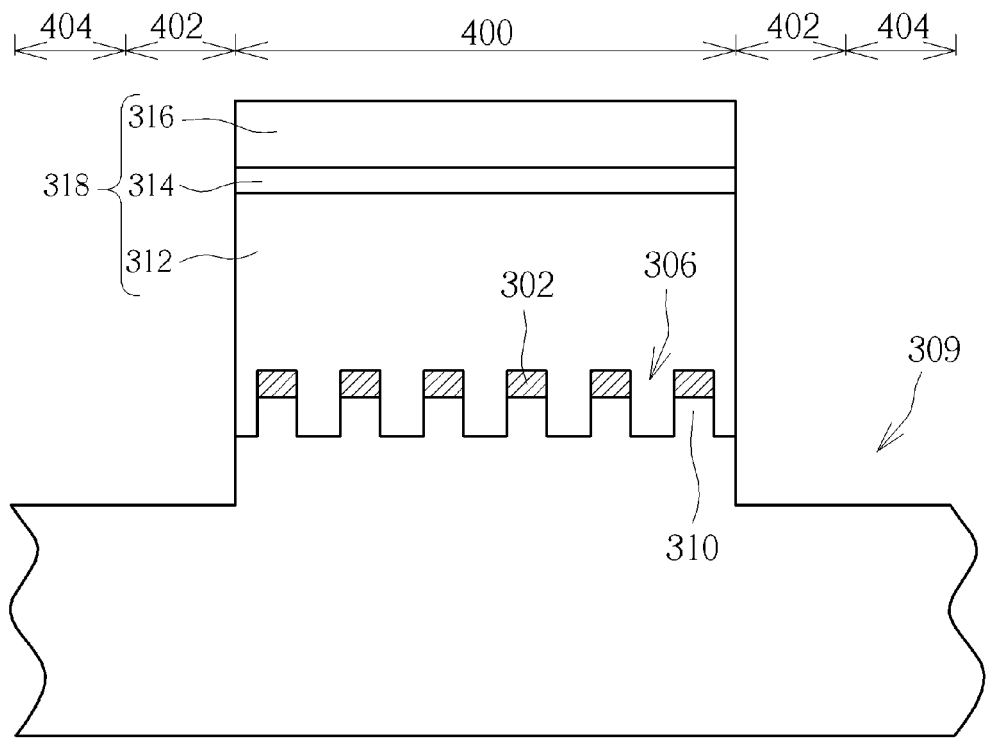
FIG. 9 to FIG. 13 are schematic diagrams of the fabrication method of a non-planar transistor according to the second embodiment in the present invention.

Then, please see FIG. 7 and FIG. 8, wherein FIG. 8 is a three dimensional view of the non-planar transistor and FIG. 7 is a cross-sectional view taken along line AA' in FIG. 8. A gate dielectric layer 332 is then formed to cover the fin structure 330. The gate dielectric layer 332 can be, for example, a silicon layer or a high-k dielectric layer. Then, a gate layer 334 can be formed on the gate dielectric layer 332. The gate layer 334 can include a variety of conductive materials, such as poly-silicon or metal. Next, after patterning the gate layer 334 to form the required gate structure, an ion implantation process is carried out to form the source/drain region 336 in the fin structure 330 as shown in FIG. 8. Through the above steps, a non-planar transistor 338 is completed. In the subsequent steps, an inter-layer dielectric (ILD) layer (not shown) can be further formed on the non-planar transistor 338, and a plurality of contact holes (not shown) are formed therein to provide appropriate input/output pathway toward outer circuits.

By using the method in the present invention, some drawbacks in conventional arts can be avoided. For example, in conventional arts, only an etching process is performed by using a patterned mask layer to directly form the second protruding structures. However, due to the "dense-isolation effect" or "micro-loading effect", the width of the patterned mask layer in the second region will be larger (as shown FIG. 1), so the CD of the second protruding structures in the second region will become larger as well. Thus, the present invention includes the step of removing the first protruding structure 310 in the second region 402, so as to keep the CD uniformity of the fin structure 330.

Moreover, because the second protruding structures in conventional arts are formed by one single etching process, the second protruding structure in conventional arts is easy to have tapered sidewalls, especially those at the edge of the second protruding structures. Accordingly, the present invention uses two separated etching steps to form the second protruding structures 324. Since the fin structure 330 only refers to the upper portion of the second protruding structures 324 which has vertical sidewalls, the CD of the fin structure 330 can be on target and meet the desired value.

It is another salient feature that the step of removing the first fin structures 310 in the second region 402 (FIG. 3 to FIG. 4) is performed between the etching step for forming the first trench 306 (FIG. 2) and the etching step for forming the second trench 320 (FIG. 6). If the removing step is performed before the two etching steps, the edge CD problem may still occur. If the removing step is performed after the two etching steps, the removing step cannot completely remove the fin structure since the trench is too deep and a silicon pillar structure will remain in the second region. Accordingly, the method in the present invention can ensure the CD of the fin structures and therefore upgrade the quality of the devices.

Please refer to FIG. 9 to FIG. 12, which are schematic diagrams of the fabrication method of a non-planar FET according to the second embodiment in the present invention. The previous steps in the second embodiment are similar to those in the first embodiment as in FIG. 1 to FIG. 3. After the steps in FIG. 1 to FIG. 3, please see FIG. 9. At least one etching process is performed by using the patterned photoresist layer 316 as a mask to sequentially pattern the ARC layer 314, the auxiliary mask layer 312, and then remove the mask layer 302 and the first protruding structure 310 in the second region 402. In the present embodiment, the etching process further removes the substrate 300 in the second region 402 and the third region 404, thereby forming a fifth trench 309 in the second region 402 and the third region 404. The fifth trench 309 is not level with the first trench 306 but is deeper than the first trench 306.

Figure 10:
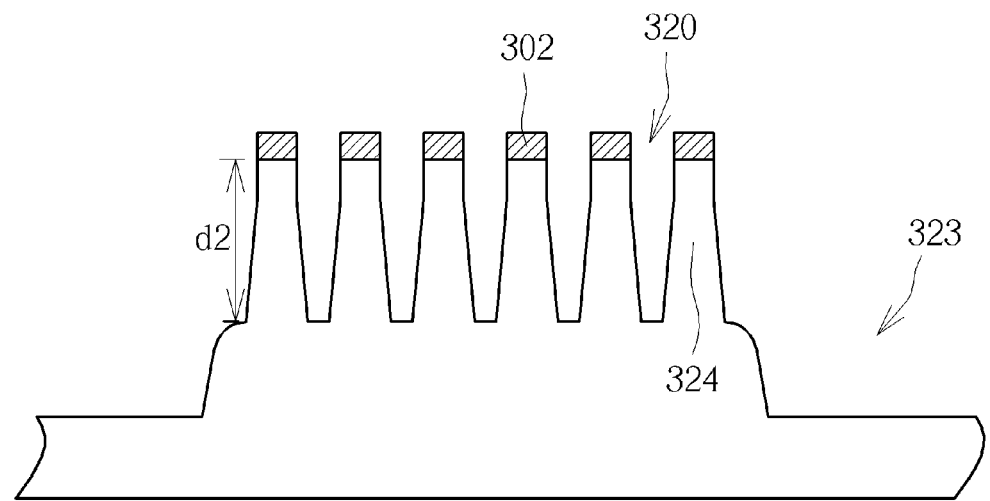

As shown in FIG. 10, an etching process is performed by using the patterned mask layer 302 as a mask to simultaneously deepen the first trenches 306 and the fifth trench 309. In the first region 400, each first trench 306 is deepened to form a second trench 320. In the second region 402 and the third region, the fifth trench 309 is deepened to form a sixth trench 323. It is understood that the sixth trench 323 is also deeper than the second trench 320. Each first protruding structure 310 becomes a second protruding structure 324. In one embodiment, each second trench 320 has a depth d2 which is substantially between 1200 angstroms and 2500 angstroms. The etching rate of forming the second trench 320 is faster than that of forming the first trench 306, so the lower portion of the second trench 320 may include tilted sidewalls.

Figure 11:
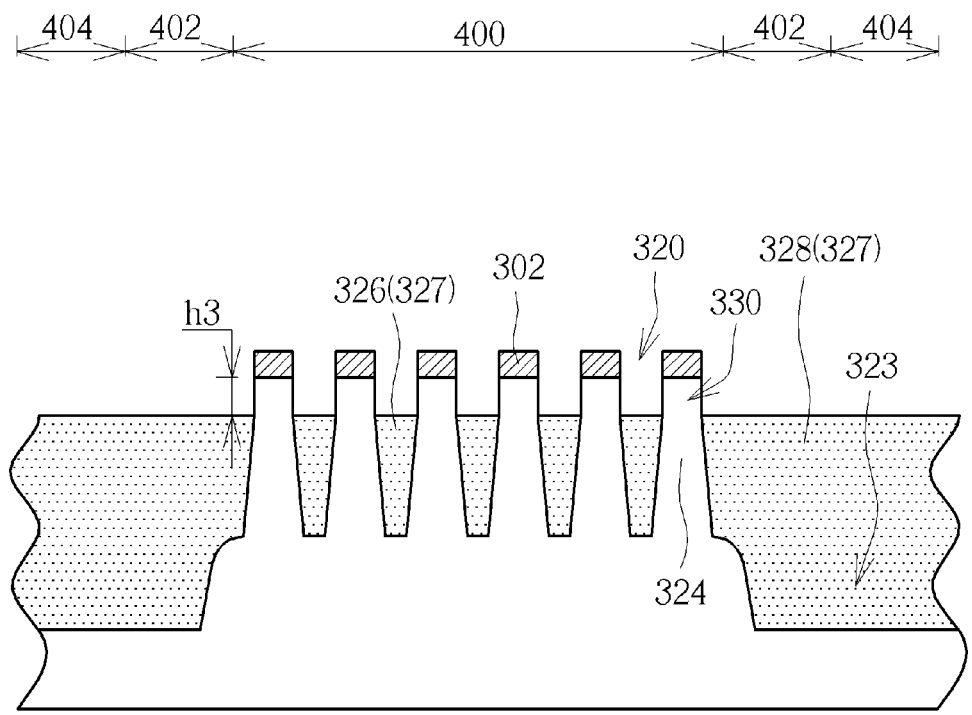

As shown in FIG. 11, an insulation layer 327 is filled into the second trenches 320 and the sixth trench 323 to form a plurality of fin-STIs 326 in the second trench 320 and an STI 328 in the sixth trench 322. For example, an insulation layer containing SiO$_2$ is deposited on the substrate 300 to completely fill the second trenches 320 and the sixth trench 323. Then, a planarization process including an etching back step is performed to remove a part of the insulation layer until exposing the second protruding structures 324. In one embodiment, the second protruding structures 324 having a height h3 is exposed, wherein the height h3 is substantially equal to or smaller than the first depth d1. After forming the fin-STIs 326 and the STI 328, a plurality of fin structures 330 are formed simultaneously. The fin structure 330 refers to each upper portion of the second protruding structures 324 that protrudes over the fin-STIs 326. In other words, the fin structure 330 is the portion of the substrate 300 that is exposed and not covered by the fin-STI 326. In one embodiment, the mask layer 302 can be removed after forming the fin structures 330. In another embodiment, the mask layer 302 can remain.

Figure 12:
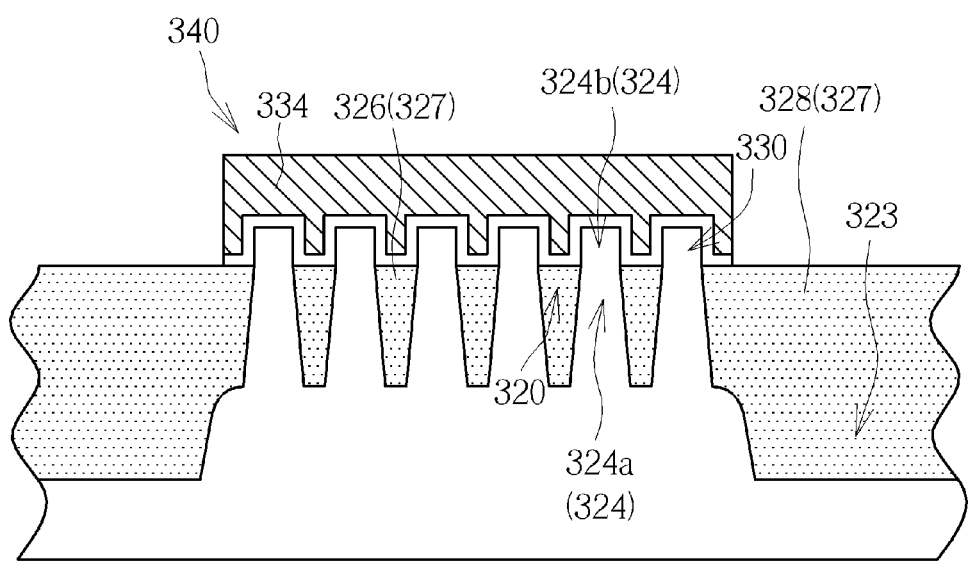
Figure 13:
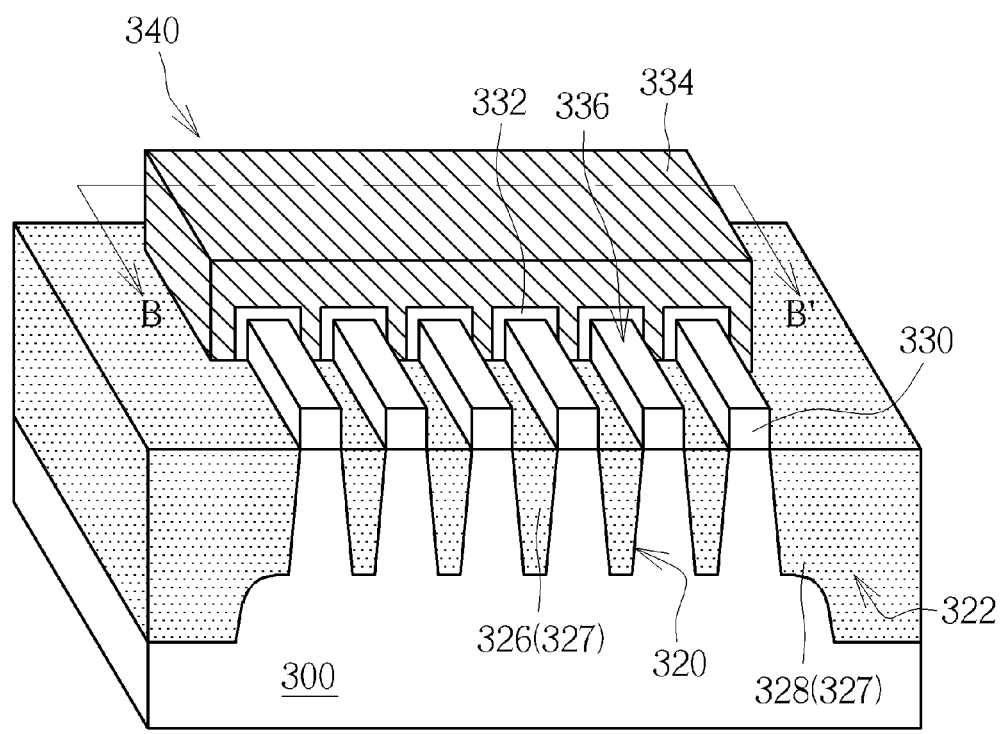

Then, please see FIG. 12 and FIG. 13, wherein FIG. 13 is a three dimensional view of the non-planar transistor and FIG. 12 is a cross-sectional view taken along line BB' in FIG. 13. A gate dielectric layer 332 is formed to cover the fin structure 330. The gate dielectric layer 332 can be, for example, a silicon layer or a high-k dielectric layer. Then, a gate layer 334 can be formed on the gate dielectric layer 332. The gate layer 334 can include a variety of conductive materials, such as polysilicon or metal. Next, after patterning the gate layer 334 to form the required gate structure, anion implantation process is carried out to form the source/drain region 336 in the fin structure 330 as shown in FIG. 13. Through the above steps, the Fin-FET 340 structure in FIG. 13 can be provided.

As shown in FIG. 13, the non-planar transistor 340 includes a substrate 300, at least a fin structure 330, a gate dielectric layer 332, a gate 334, a source/drain region 336, at least a fin-STI 326 and an STI 323. An active region such as the first region 400 and an isolation region such as the third region 402 are defined on the substrate 300. At least a second trench 320 is disposed in the active region and a sixth trench 323 is disposed in the isolation region, wherein the sixth trench 323 is deeper than the second trench 320. An insulation layer 327 is disposed in the second trench 320 and the sixth trench 323, wherein the insulation layer 327 in the second trench 320 (fin-STI 326) is level with that in the sixth trench 323 (STI 328). The fin structure 330 is disposed between each of the two second trenches 320 and protrudes over the fin-STI 326. The gate 334 is disposed on the fin structure 330 and the gate dielectric layer 332 is disposed between the gate 334 and the fin structure 330. In one embodiment, the second protruding structure 324 has an upper portion 324b having a substantial vertical sidewall, and a lower portion 324a having a tilted sidewall. The upper portion 324b has a height between 200 and 400 angstroms and the lower portion 324a has a height between 1000 and 2000 angstroms. In one embodiment, an upper surface of the insulation layer 327 is level with the boundary between the upper portion 324b and the lower portion 324a. In another embodiment, the upper surface of the insulation layer 327 is higher than the lower portion 324a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-planar transistor, comprising:
a substrate having an active region and an isolation region, wherein the isolation region encompasses the active region;
a plurality of shallow trenches disposed in the substrate in the active region, wherein a portion of the substrate between each two shallow trenches is defined as a protruding structure, and the protruding structure has an upper portion having a substantially vertical sidewall and a lower portion having a tilted sidewall;
a deep trench disposed in the substrate in the isolation region, wherein the deep trench is deeper than the shallow trenches and has a shoulder portion;
an insulation layer disposed in the shallow trenches and the deep trench, wherein an upper surface of the insulation layer in the shallow trenches is level with that in the deep trench;
a portion of the protruding structure that protrudes over the insulation layer defined as a fin structure;
a conductive layer disposed on the fin structure; and
a gate dielectric layer disposed between the fin structure and the conductive layer.

2. The non-planar transistor according to claim 1, wherein the upper portion has a height between 200 and 400 angstroms.

3. The non-planar transistor according to claim 1, wherein the lower portion has a height between 1000 and 2000 angstroms.

4. The non-planar transistor according to claim 1, wherein the upper surface of the insulation layer is higher than the lower portion.

5. The non-planar transistor according to claim 1, wherein the shoulder portion includes a round corner.

6. The non-planar transistor according to claim 1, wherein each of the fin structures has a same size.

* * * * *